(12) United States Patent
Yu et al.

(10) Patent No.: US 12,133,396 B2
(45) Date of Patent: Oct. 29, 2024

(54) SEMICONDUCTOR DEVICE, INTEGRATED CIRCUIT AND METHOD OF MANUFACTURING THE SAME

(71) Applicant: TAIWAN SEMICONDUCTOR MANUFACTURING COMPANY LTD., Hsinchu (TW)

(72) Inventors: Chia-Jung Yu, Hsinchu (TW); Pin-Cheng Hsu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 299 days.

(21) Appl. No.: 17/461,940

(22) Filed: Aug. 30, 2021

(65) Prior Publication Data

US 2023/0065619 A1    Mar. 2, 2023

(51) Int. Cl.
*H10B 61/00*        (2023.01)
*H10K 10/46*        (2023.01)

(52) U.S. Cl.
CPC ............ *H10B 61/22* (2023.02); *H10K 10/46* (2023.02)

(58) Field of Classification Search
CPC .................................. H10B 61/22; H10K 10/46
See application file for complete search history.

(56) References Cited

U.S. PATENT DOCUMENTS

| | | | | |
|---|---|---|---|---|
| 2014/0353662 | A1* | 12/2014 | Shukh | H10B 63/30 257/43 |
| 2019/0013353 | A1* | 1/2019 | Lee | H10B 61/22 |
| 2022/0392957 | A1* | 12/2022 | Gomes | H10B 63/30 |
| 2023/0027402 | A1* | 1/2023 | Yamazaki | H01L 21/8234 |

OTHER PUBLICATIONS

J. Robertson, High dielectric constant oxides, Eur. Phys. J. Appl. Phys. 28, 265-291 (2004) (Year: 2004).*

Young-geun Ha, Solution-Deposited Organic-Inorganic Hybrid Multilayer Gate Dielectrics. Design, Synthesis, Microstructures, and Electrical Properties with Thin-Film Transistors, J. Am. Chem. Soc. 2011, 133, 10239-10250 (Year: 2011).*

\* cited by examiner

*Primary Examiner* — Shih Tsun A Chou
(74) *Attorney, Agent, or Firm* — WPAT LAW; Anthony King

(57) ABSTRACT

A semiconductor device, an integrated circuit, and a method of manufacturing the same are provided. The semiconductor device includes a substrate, a thin-film transistor (TFT) over the substrate, and a magnetoresistive random-access memory (MRAM) cell electrically coupled to the TFT. The TFT includes a gate electrode; an active layer disposed above the gate electrode; source/drain electrodes disposed above the gate electrode and separated by the active layer; and at least two dielectric layers disposed between the gate electrode and the source/drain electrodes.

20 Claims, 8 Drawing Sheets

SEMICONDUCTOR DEVICE, INTEGRATED CIRCUIT AND METHOD OF MANUFACTURING THE SAME

BACKGROUND

Many electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. A magnetic random access memory (MRAM) device is currently explored to facilitate a static random access memory (SRAM) to own a high non-volatile storage density. The MRAM device includes an array of densely packed MRAM cells. In each MRAM cell, a magnetic tunneling junction (MTJ) element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
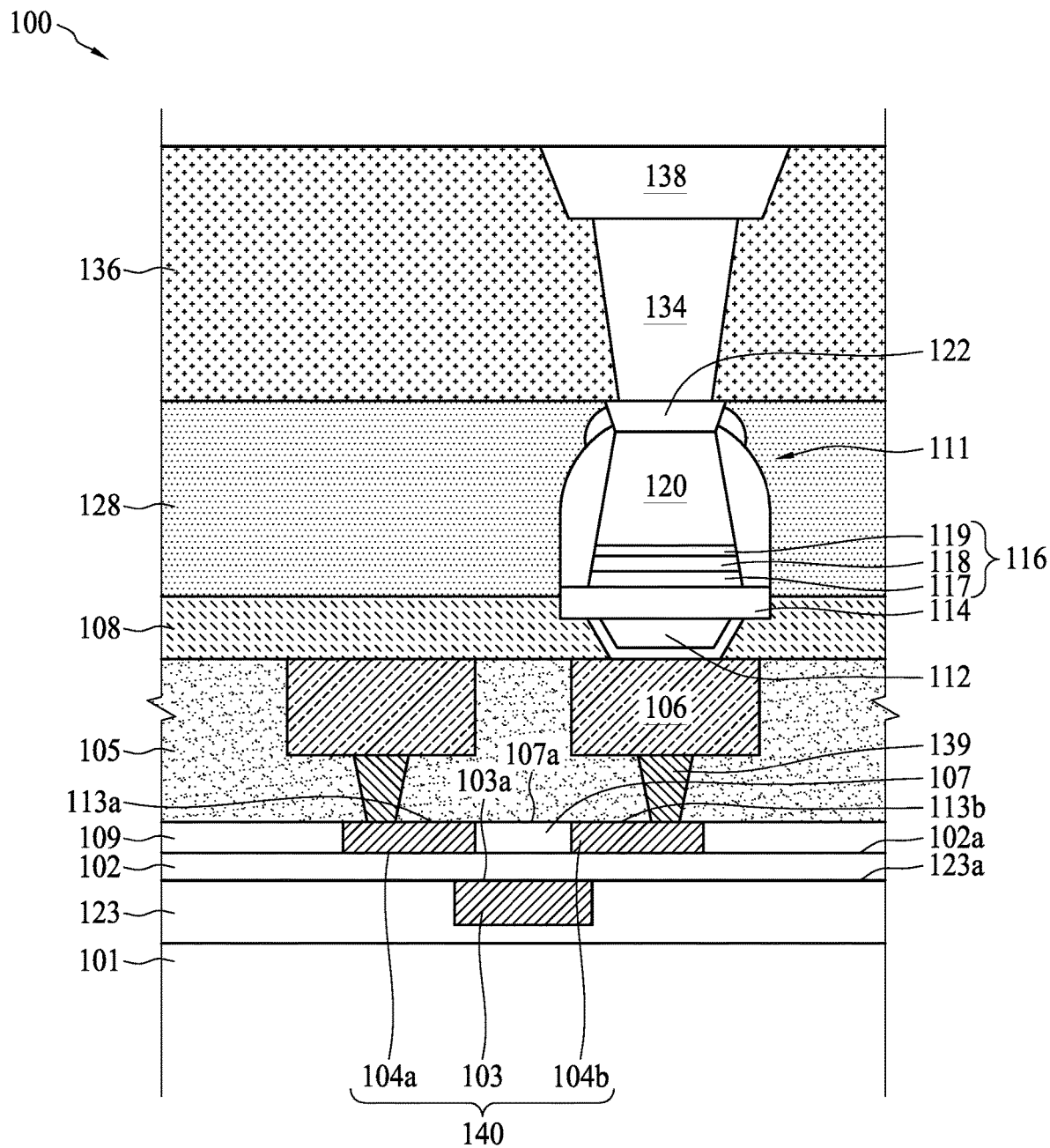
FIG. 1 illustrates a cross-sectional view of a memory device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05% For example, two numerical values can be deemed to be "substantially" the same or equal if a difference between the values is less than or equal to ±10% of an average of the values, such as less than or equal to ±5%, less than or equal to ±4%, less than or equal to ±13%, less than or equal to ±2%, less than or equal to ±1%, less than or equal to ±0.5%, less than or equal to ±0.1%, or less than or equal to ±(05%, For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to +4°, less than or equal to ±3°, less than or equal to ±2°, less than or equal to −1°, less than or equal to ±0.5° less than or equal to ±0.1°, or less than or equal to ±0.05°.

An integrated circuit (IC) often comprises a back-end-of-line (BEOL) interconnect structure and semiconductor devices on a front side of a semiconductor substrate. The semiconductor devices may include, for example, various n-type metal-oxide: (NMOS) and/or p-type metal-oxide semiconductor (PMOS) devices, such as transistors, capacitors, resistors, diodes, photo-diodes, fuses, magnetic random access memory (MRAM) cells, and the like. The semiconductor devices may, for example, be in the BEOL interconnect structure, and/or between the semiconductor substrate and the BEOL interconnect structure. A technical problem may reside in how to provide sufficient power to the semiconductor devices or how to reduce the power consumption thereof.

In view of the foregoing, the present disclosure is directed to an IC, where semiconductor devices, such as MRAM cells are arranged within a BEOL interconnect structure, of which at least one of the technical problems mentioned above may be resolved.

FIG. 1 illustrates a cross-sectional view of a memory device 100 according to some embodiments of the present disclosure. The memory device 100 includes a substrate 101, a thin-film transistor (TFT) 140, and a magnetoresistive random-access memory (MRAM) cell 111.

The substrate 101 may be, for example, a bulk semiconductor substrate (e.g., a bulk silicon substrate) or a silicon-on-insulator (SOI) substrate, or a wafer. An SOI substrate may include a layer of a semiconductor material, such as silicon, formed on an insulating layer. The insulating layer may be, for example, a buried oxide layer or a silicon oxide layer. The insulating layer is provided on a substrate, typically, a silicon or glass substrate. Other substrates, such as a multi-layered or gradient substrate may also be used. The substrate 101 may include electrical devices such as various n-type metal-oxide (NMOS) and/or p-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, and the like.

The process forming the individual devices such as transistors, capacitors, resistors, diodes, photo-diodes, fuses, and the like within the substrate 101 may be collectively referred as the front-end-of-line (FEOL) process, which is the first portion of integrated circuit (IC) fabrication where the individual devices (transistors, capacitors, resistors, etc.) are patterned in a substrate (e.g., wafer). FEOL generally covers everything up to (but not including) the deposition of metal layers.

Following the FEOL process is the back-end-of-line (BEOL) process, which is the second portion of IC fabrication where the individual devices are interconnected with wiring or metal layers on the IC. The BEOL process generally begins when the first metal layer or $M_1$ is deposited on the wafer. It may include contacts, insulating layers, metal layers, and bonding sites for chip-package connections. As a result, one or more metal layers, $M_1$-$M_n$ may be formed over an interlayer dielectric (ILD) layer. A typical IC may include three or more metal layers, followed by a final passivation layer. The final passivation layer may be used for protecting the IC from mechanical abrasion during probe and packaging and to provide a barrier to contaminants. After the final passivation layer, the bonding pads for input/output will be formed, followed by a post-fabrication process such as wafer probe, die separation, and packaging. In more details, the BEOL process may include: adding a metal layer $M_n$, adding an intra metal dielectric (IMD) layer, making vias through the IMD layer to connect to lower metal layer contacts, and forming higher metal layer contacts connected to the vias.

The thin-film transistor (TFT) 140 may be disposed over a first ILD layer 123 disposed over the substrate 101 during the BEOL process. A portion of the TFT 140 may be disposed within the first ILD layer 123. The first ILD layer 123 may include a low dielectric constant (k value less than about 2.5) material. For example, the first ILD layer 123 may include, for example, an oxide, silicon dioxide ($SiO_2$), borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

The TFT 140 may include a gate electrode 103, a gate dielectric layer 102, and source/drain electrodes 104a, 104b. The TFT 140 may be polycrystalline silicon TFT or amorphous silicon TFT.

The gate electrode 103 is disclosed within the first ILD layer 123. The gate electrode 103 may have an upper surface 103a exposed from an upper surface 123a of the first ILD layer 123. In some embodiments, the gate electrode 103 has an upper surface 103a substantially coplanar with an upper surface 123a of the first ILD layer 123. The gate electrode 103 may include silicon, glass, plastic, or any other appropriate material, or may include a metal or any other appropriate conductive material. In some embodiments, the gate electrode 103 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi, copper/molybdenum titanium (Cu/MoTi, and a combination thereof.

The gate dielectric layer 102 is disposed over the first ILI) layer 123. The gate dielectric layer 102 may include a high-k material (e.g., k value not less than 20). For example, the gate dielectric layer 102 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof. In some embodiments, the gate dielectric layer 102 includes hafnium oxide ($HfO_2$).

The source/drain electrodes 104a, 104b are disposed over the gate dielectric layer 102. The source/drain electrodes 104a, 104b are separated from each other by an active layer 107 formed over the gate dielectric layer 102 above the gate electrode 103. The source/drain electrodes 104a, 104b may have an upper surface 113a, 113b exposed from an upper surface 107a of the active layer 107. In some embodiments, the source/drain electrodes 104a, 104b have an upper surface 113a, 113b substantially coplanar with an upper surface 107a of the active layer 107. The source/drain electrodes 104a, 104b may include the same material as that of the gate electrode 103. For example, the source/drain electrodes 104a, 104b may include a metal or any other appropriate conductive material. In some embodiments, the source/drain electrodes 104a, 104b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 104a and the drain electrode 104b may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The active layer 107 serves to form a channel allowing electrons to move therein between the source/drain electrodes 104a, 104b. The active layer 107 may comprise an oxide semiconductor material including, for example, silicon, IGZO, ITZO, IZO, AGZO, or a combination thereof. In some embodiments, the active layer 107 includes IGZO.

The MRAM cell 111 is electrically coupled to the TFT 140. The MRAM cell 111 may be electrically coupled to the TFT 140 by a first metal line 112 disposed under the bottom electrode 114. In some embodiments, the MRAM cell 111 is electrically coupled to the TFT 140 through the first metal line 112, the first interconnect line 106, and the first conductive via 139. The TFT 140 may be disposed between the MRAM cell 111 and the substrate 101 in a BEM, structure. Alternatively, the TFT 140 may be disposed above the MRAM cell 111.

A bit line (BL) may be electrically coupled to one end of the MRAM cell 111 by a second interconnect line 138 above the top electrode 120. In some embodiments, the MRAM cell 111 is electrically coupled to the BL through the second conductive via 122, the third conductive via 134, and the second interconnect line 138. A source line (SL) may be electrically coupled to an opposite end of the MRAM cell 111 through the TFT 140. Thus, application of a suitable word line (WL) voltage to the gate electrode 103 of the TFT 140 electrically couples the MRAM cell 111 between the BL and the SE. Consequently, by providing suitable bias conditions, the MRAM cell 111 can be switched between two states of electrical resistance, a first state with a low-resistance and a second state with a high-resistance, to store data. The MRAM cell 111 may be disposed within an interlayer dielectric (ILD) layer 128 or a BEOL structure over the substrate 101. The MRAM cell 111 may include a bottom electrode 114, a magnetic tunnel junction (MU) 116, and a top electrode 120.

A portion of the bottom electrode 114 may be disposed in a dielectric layer 108 over the substrate 101. The bottom electrode 114 may include, for example, tantalum, tantalum nitride, or ruthenium.

The MTJ 116 may be disposed adjacent to the bottom electrode 114. In some embodiments, the NM 116 is disclosed on the bottom electrode 114. The 116 may include a lower ferromagnetic electrode 117 and an upper ferromagnetic electrode 119, which may be separated from each other by a tunneling barrier layer 118. In some embodiments, the lower ferromagnetic electrode 117 has a fixed or "pinned" magnetic orientation, while the upper ferromagnetic electrode 119 has a variable or "free" magnetic orientation, which may be switched between two or more distinct magnetic polarities that each represents a different data state, such as a different binary state. A "fixed" ferromagnetic layer refers to one having a magnetic orientation that is "fixed." A "free" ferromagnetic layer refers to one that is capable of changing its magnetic orientation between two magnetic states. If the magnetic orientations of the pinned ferromagnetic electrode 117 and the free ferromagnetic electrode 119 are in a parallel orientation, it is more likely that electrons will tunnel through the tunneling barrier layer 118, so the MTJ 116 is in a low-resistance state. Conversely, if the magnetic orientations of the pinned ferromagnetic electrode 117 and the free ferromagnetic electrode 119 are in an anti-parallel orientation, it is less likely that electrons will tunnel through the tunneling barrier layer 118, so the MTJ 116 is in a high-resistance state. Because of this binary nature, the MTJ 116 may be used in memory cells to store digital data, with the low-resistance state corresponding to a first data state (e.g., logical "0") and the high-resistance corresponding to a second date state (e.g., logical "1"). In some embodiments, the MTJ may be vertically "flipped" such that the lower magnetic electrode 117 has a "free" magnetic orientation, while the upper ferromagnetic electrode 119 has a "pinned" magnetic orientation. In some embodiments, the lower ferromagnetic electrode 117 includes iron, cobalt, nickel, iron cobalt, nickel cobalt, cobalt iron boride, iron boride, iron platinum, iron palladium, or the like. In some embodiments, the upper ferromagnetic electrode 119 includes iron, cobalt, nickel, iron cobalt, nickel cobalt, cobalt iron boride, iron boride, iron platinum, iron palladium, or the like.

The tunneling barrier layer 118 provides electrical isolation between the upper ferromagnetic electrode 119 and the lower ferromagnetic electrode 117, while still allows electrons tunnel through under proper conditions. The tunneling barrier layer 118 may include, for example, magnesium oxide, aluminum oxide (e.g., $Al_2O_3$), nickel oxide, gadolinium oxide, tantalum oxide, molybdenum oxide, titanium oxide, tungsten oxide, or the like.

The top electrode 120 electrically couples the second conductive via 122 to the MTJ 116. The top electrode 120 may include, for example, tantalum, tantalum nitride, or ruthenium.

Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption. Therefore, MRAM is one promising candidate for next generation non-volatile electronic memory due to advantages over current electronic memory. Since MRAM is preferably disposed in the BEOL interconnect structure, and/or between the semiconductor substrate and the BEOL interconnect structure, a TFT is preferably used to provide power to the MRAM as the BEOL process cannot perform a temperature as higher as in the FEOL process (the process temperature in the BEOL process is typically below 400° C.), which makes a TFT a better choice compared to other transistors to be electrically coupled to the MRAM as it can be made under the BEOL process temperature. Nevertheless, as continuing demand requests smaller size of the TFT and thus smaller metal pitches, parasitic capacitance may become a major concern between metal lines or source/drain electrodes and gate electrodes of a TFT.

In view of the foregoing, the present disclosure further provides the following embodiments that may resolve at least one of the problems mentioned above.

Figure 2:
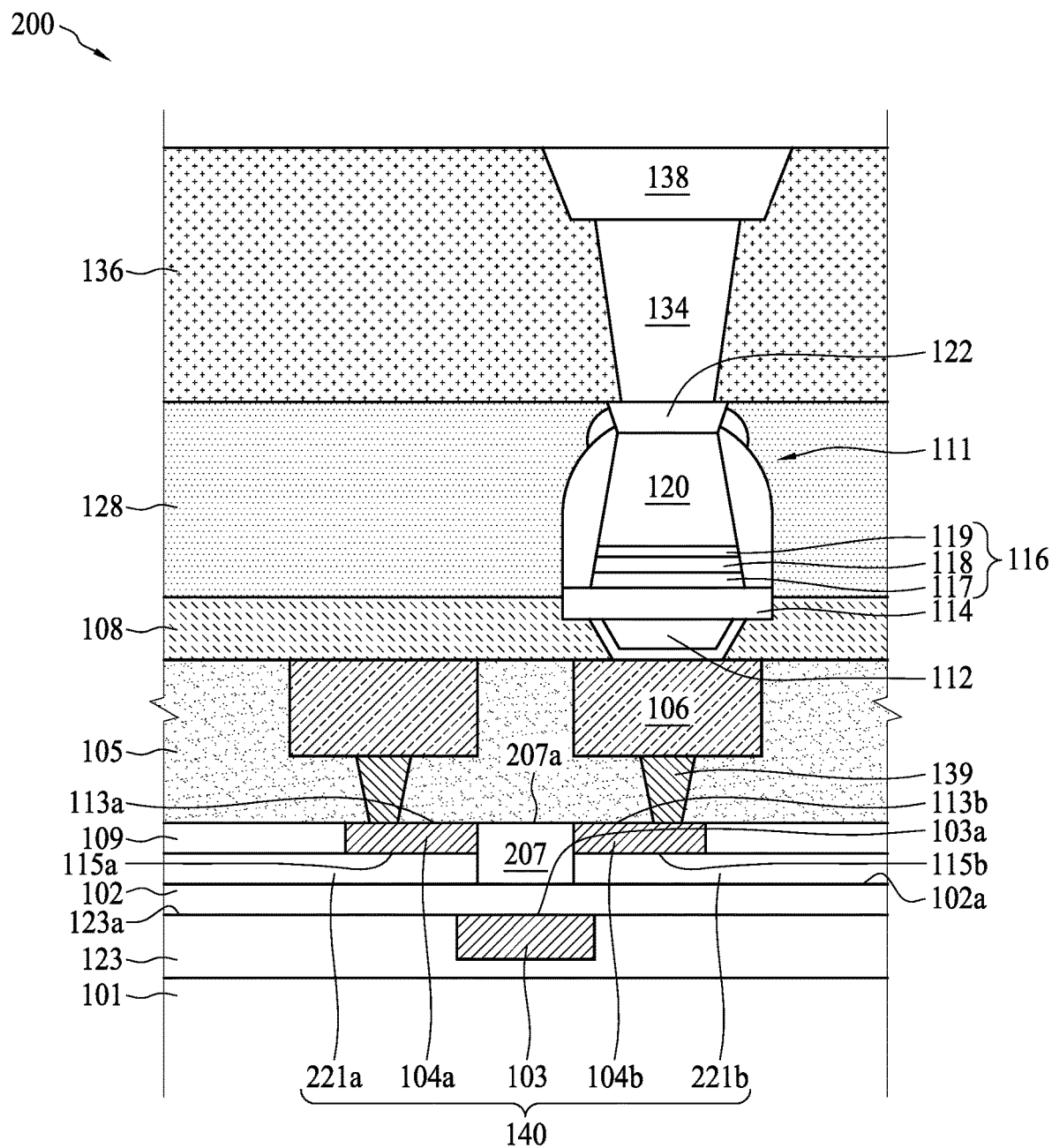
FIG. 2 illustrates a cross-sectional view of a memory device according to some embodiments of the present disclosure.

FIG. 2 illustrates a cross-sectional view of a memory device 200 according to some embodiments of the present disclosure. The memory device 200 illustrated in FIG. 2 is similar to that illustrated in FIG. 1 with a difference including that the TFT 140 includes a gate electrode 103, a gate dielectric layer 102, at least one dielectric layer 221a, 221b disposed above the gate dielectric layer 102, and source/drain electrodes 104a, 104b disposed above the dielectric layer 221a, 221b. The TFT 140 may be polycrystalline silicon TFT or amorphous silicon TFT.

The gate electrode 103 is disclosed in a first ILD layer 123 over a substrate 101. The gate electrode 103 may have an upper surface 103a exposed from an upper surface 123a of the first ILD layer 123. In some embodiments, the gate electrode 103 has an upper surface 103a substantially coplanar with an upper surface 123a of the first ILD layer 123. The gate electrode 103 may include silicon, glass, plastic, or any other appropriate material, or may include a metal or any other appropriate conductive material. In some embodiments, the gate electrode 103 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The gate dielectric layer 102 is disposed over the first ILD layer 123. The gate dielectric layer 102 may include a high-k material (e.g., k value not less than 20). For example, the gate dielectric layer 102 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof. In some embodiments, the gate dielectric layer 102 includes hafnium oxide ($HfO_2$).

The dielectric layer 221a, 221b may be disposed over the gate dielectric layer 102. The dielectric layer 221a, 221b may be disposed below the source/drain electrodes 104a, 104b and above the gate dielectric layer 102. The dielectric layer 221a, 221b may be sandwiched between the source/drain electrodes 104a, 104b and the gate dielectric layer 102. The source/drain electrodes 104a, 104h may have an overlapped projection area with the gate electrode 103. A portion of the projection area of the dielectric layer 221a, 221b may overlap the overlapped projection area of the source/drain electrodes 104a, 104b and the gate electrode 103. The dielectric layer 221a between the source electrode 104a and the gate dielectric layer 102 and the dielectric layer 221b between the drain electrode 104h and the gate dielectric layer 102 may be separated from each other by an active layer 207. The dielectric layer 221a, 221b may include a low dielectric constant (e.g., k value less than about 3.9, preferably less than about 2.5) material. For example, the dielectric layer 221a, 221b may include, for example, an oxide, silicon dioxide ($SiO_2$), borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). In some embodiments, the dielectric layer 221a, 221b includes silicon dioxide ($SiO_2$). The thickness of the dielectric layer 221a, 221b should be so configured that the parasitic capacitance between the source/drain electrodes 104a, 104b and the gate electrode may be eased. In some embodiments, the thickness of the dielectric layer 221a, 221b is less than 5 nm.

The source/drain electrodes 104a, 104b are disposed over the dielectric layer 221a, 221b, The source/drain electrodes 104a, 104b and the gate electrode 103 may be separated by at least two dielectric layers. The source/drain electrodes 104a, 104h may be spaced from the gate electrode 103 by a gate dielectric layer 102 and the dielectric layer 221a, 221b. The source/drain electrodes 104a, 104b may be disposed above the gate electrode 103 by two dielectric layers 102, 221a, 221b, where one of the dielectric layers 102, 221a, 221b includes a high-k material k value not less than about 20) and the other includes a low-k material (e.g., k value less than about 3.9, preferably less than about 2.5). An upper surface 113a, 113b of the source/drain electrodes 104a, 104b may be adjacent to a dielectric layer 105 including a low-k material and a bottom surface 115a, 115b of the source/drain 104a, 104b may be adjacent to a dielectric layer 221a, 221b including a low-k material.

The source/drain electrodes 104a, 104h are separated from each other by an active layer 207 formed over the gate dielectric layer 102 above the gate electrode 103. The source/drain electrodes 104a, 104h may have an upper surface 113a, 113b exposed from an upper surface 207a of the active layer 207. In some embodiments, the source/drain electrodes 104a, 104b have an upper surface 113a, 113b substantially coplanar with an upper surface 207a of the active layer 207. The source/drain electrodes 104a, 104b may include the same material as that of the gate electrode 103. For example, the source/drain electrodes 104a, 104b may include a metal or any other appropriate conductive material. In some embodiments, the source/drain electrodes 104a, 104b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 104a and the drain electrode 104b may include a conductive metal selected from the group consisting of aluminum (Al), tungsten (W), copper (Cu), molybdenum (Mo), chromium (Cr), titanium (Ti), molybdenum tungsten (W), molybdenum titanium (MoTi), copper/molybdenum titanium (Cu/MoTi), and a combination thereof.

By disposing at least two dielectric layers 221a, 221b, 102 between the source/drain electrodes 104a, 104b) and the gate electrode 103 or at least one dielectric layer 221a, 221b between the source/drain electrodes 104a, 104b and the gate dielectric layer 102, the parasitic capacitance between the source/drain electrodes 104a, 104b and the gate electrode 103 may be eased.

The active layer 207 serves to form a channel allowing electrons to move therein between the source/drain electrodes 104a, 104b. The active layer 207 may extend from the upper surface 113a, 113b of the source/drain 104a, 104b to the upper surface 102a of the gate dielectric layer 102. The active layer 207 and the gate electrode 103 may be separated by single dielectric layer 102. The active layer 107 may separate the dielectric layer 221a below the source electrode 104a from the dielectric layer 221b below the drain electrode 104b. The active layer 207 may comprise an oxide semiconductor material including, for example, silicon, IGZO, ITZO, IZO, AGZO, or a combination thereof. In some embodiments, the active layer includes IGZO.

Figure 3:
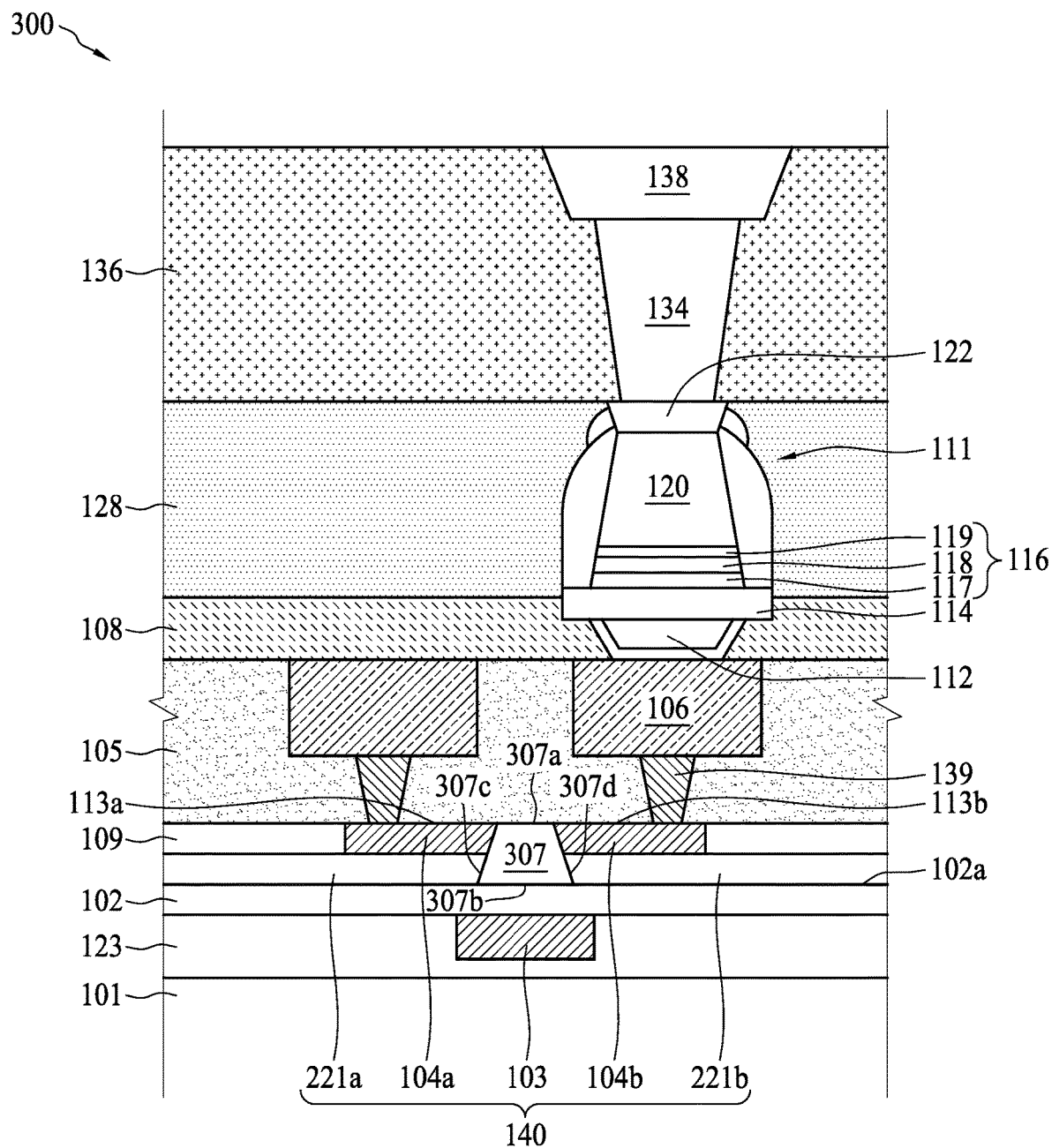
FIG. 3 illustrates a cross-sectional view of a memory device according to some embodiments of the present disclosure.

FIG. 3 illustrates a cross-sectional view of a memory device 300 according to some embodiments of the present disclosure. The memory device 300 illustrated in FIG. 3 is similar to that illustrated in FIG. 2 with a difference including that the shape of the active layer 307 may be different.

The active layer 307 includes an upper surface 307a, a bottom surface 307b opposite to the upper surface 307a, and a side surface 307c, 307d extending from the upper surface 307a to the bottom surface 307b. The upper surface 307a of the active layer 307 may be in substantially the same plane with the upper surface 113a, 113b of the source/drain electrodes 104a, 104b and the bottom surface 307b of the active layer 307 may be in substantially the same plane with the upper surface 102a of the gate dielectric layer 102. The side surface 307c, 307d may incline inwardly from the bottom surface 307e to the upper surface 307a of the active layer 307. The active layer 307 may have a substantially trapezoid shape. In some embodiments, the active layer 307 has a substantially positive trapezoid shape.

By designing the active layer 307 as having such shape, the distance between the source/drain electrodes 104a, 104b may be shorter compared to that illustrated in FIG. 2, which may improve electron mobility speed from the source electrode 104a to the drain electrode 104b.

Figure 4:
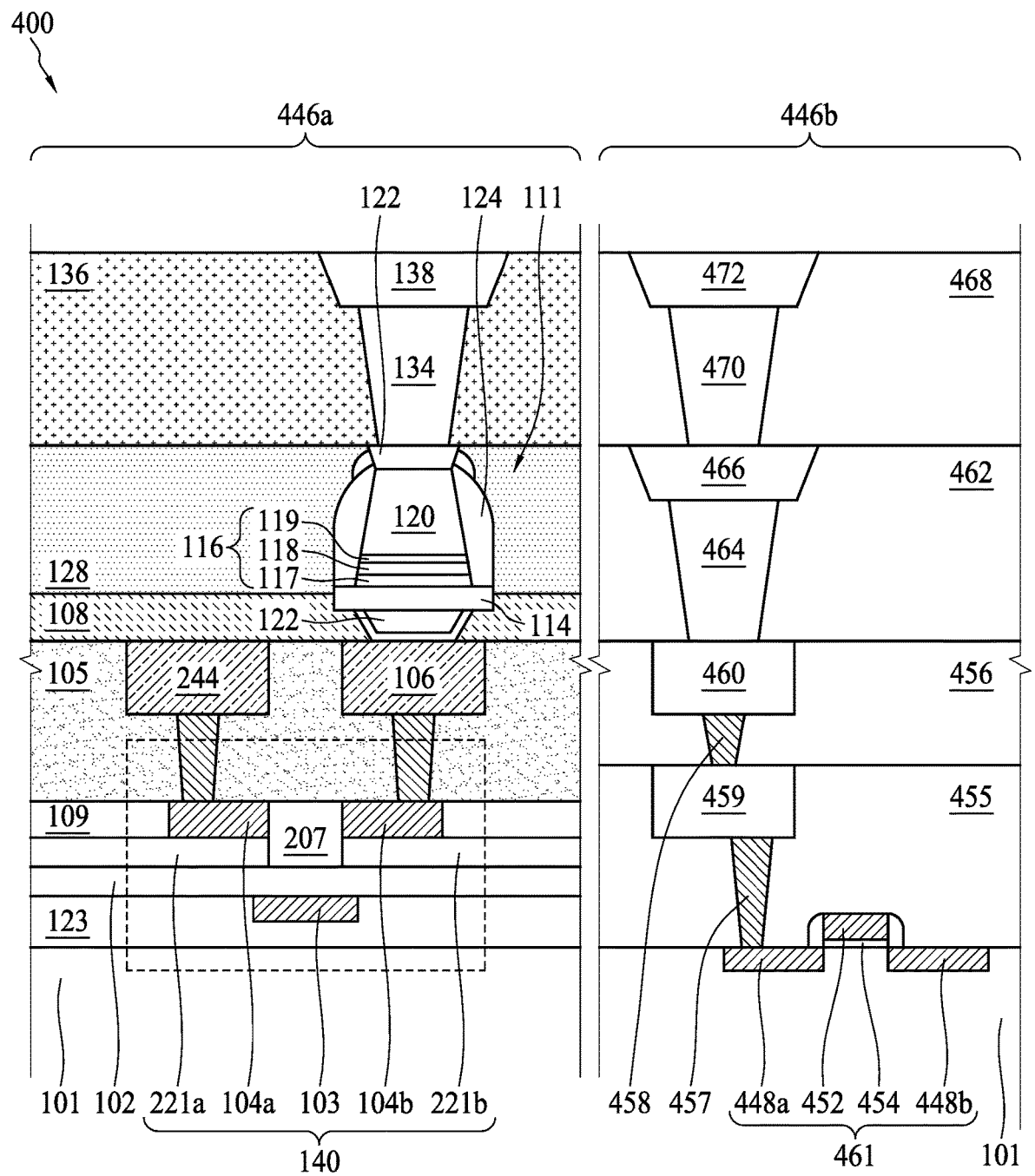
FIG. 4 illustrates a cross-sectional view of an integrated circuit according to some embodiments of the present disclosure.

FIG. 4 illustrates a cross-sectional view of an integrated circuit 400 according to some embodiments of the present disclosure. The integrated circuit 400 includes an embedded memory region 446a comprising a MRAM cell 111 electrically connected to a TFT 140 and a logic region 446b.

The embedded memory region 446a is similar to that illustrated in FIG. 2 and is not described in details for brevity.

In the logic region 446b, a transistor 461 is disposed within the substrate 101 and the first ILD layer 455. The transistor 461 may include a gate electrode 452, a gate dielectric layer 454, and source/drain regions 448a, 448b. An interconnect line 459 electrically connects to the transistor 461 by a conductive via 457.

A second ILD layer 456, a third ILD layer 462, and a fourth ILD layer 468 may be disposed over the first ILD layer 455 sequentially, where each ILD layer 456, 462, 468 may include interconnect lines 460, 466, 472 and conductive vias 458, 464, 470 for electrically connecting the interconnect lines 460, 466, 472 to each other.

FIGS. 5A-5F illustrate a method of manufacturing a memory device such as the memory device of FIG. 2.

Figure 5A:
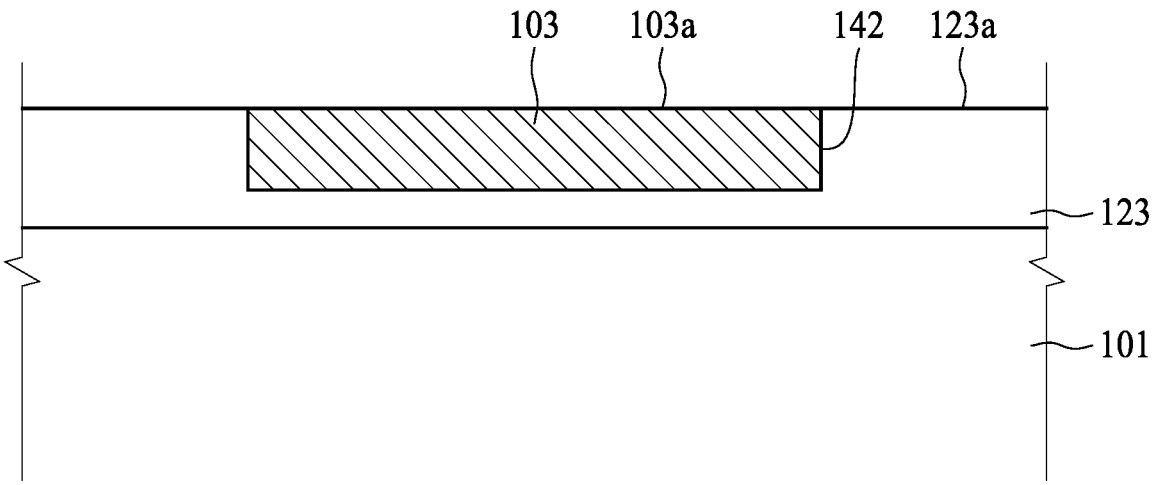
FIG. 5A, FIG. 5B, FIG. 5C, FIG. 5D, FIG. 5E, and FIG. 5F illustrate a method of manufacturing a memory device such as the memory device of FIG. 2 according to some embodiments of the present disclosure.

Referring to FIG. 5A, a gate electrode 103 is formed in a first dielectric layer 123 on a substrate 101. The first dielectric layer 123 is disposed adjacent to a surface of the substrate 101 by, for example, a chemical vapor deposition (CM) technology or other suitable technology. Subsequently, a combination of a photolithography technology and an etching technology may be performed on the first dielectric layer 123 to form a trench 142 therein for disposing the gate electrode 103. Subsequently, a metal layer is disposed in the trench 142 and on the first dielectric layer 123 by performing a sputtering technology with a conductive material. Afterwards, a gate electrode 103 in the trench 142 having an upper surface 103a coplanar with an upper surface 123a of the first dielectric layer 123 may be formed by a chemical-mechanical polishing (CMP) technology.

Figure 5B:
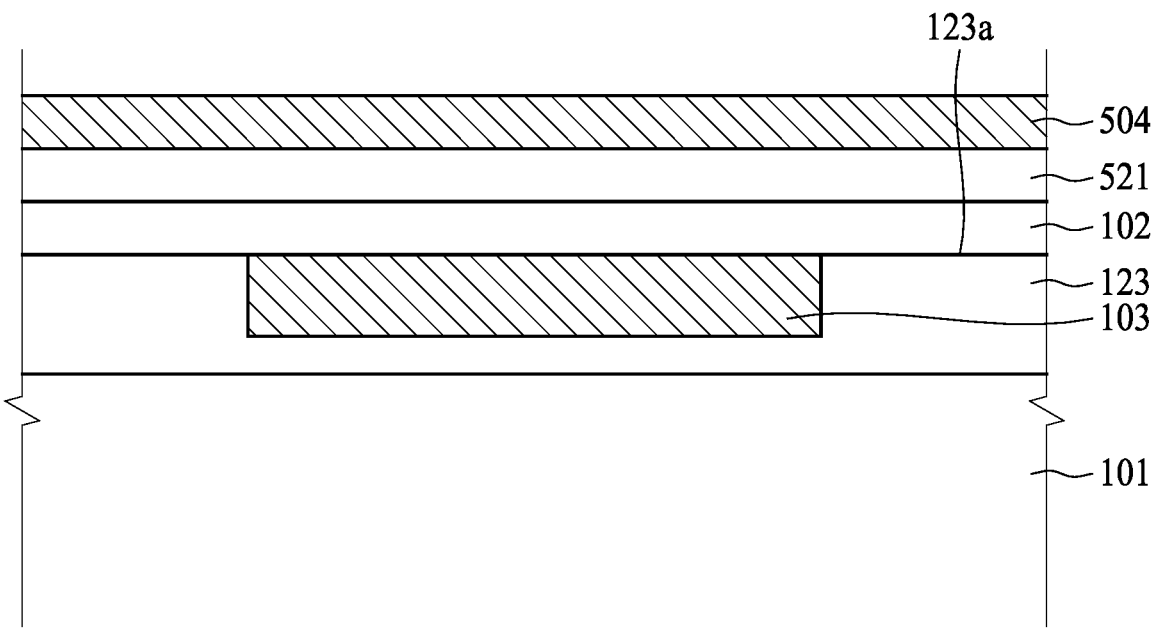

Referring to FIG. 5B, a gate dielectric layer 102, a second dielectric layer 521, and a metal layer 504 are formed on the gate electrode 103 and the first dielectric layer 123 sequentially by, for example, a chemical vapor deposition (CVD) technology, a sputtering technology, or any other suitable technologies.

Figure 5C:
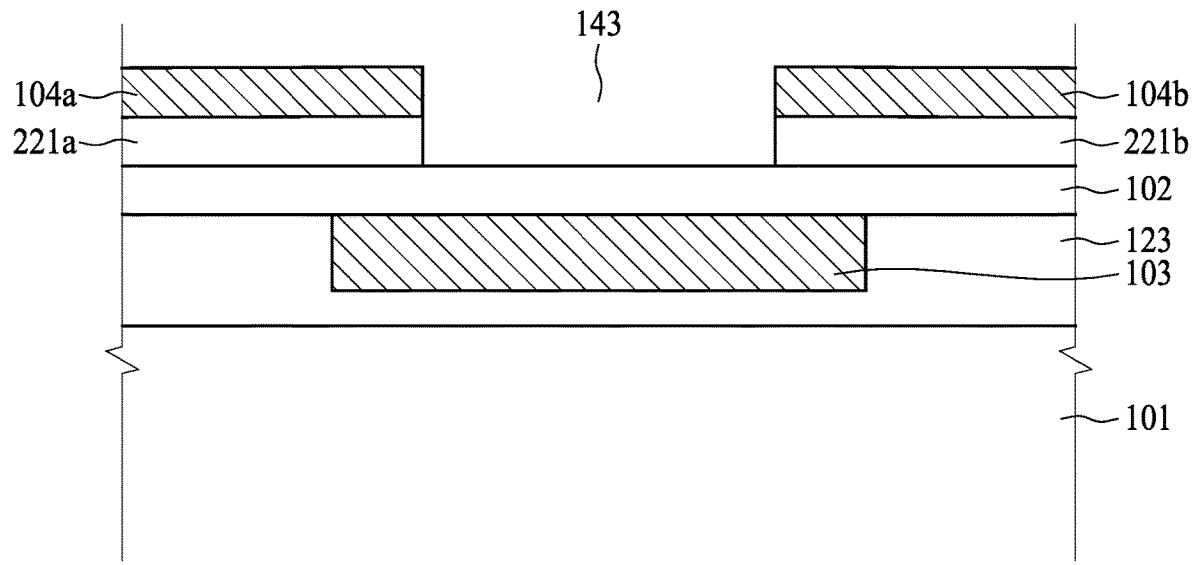

Referring to FIG. 5C, a combination of a photolithography technology and an etching technology may be performed to form an opening 143 in the second dielectric layer 521 and the metal layer 504 to define the source/drain electrodes 104a, 104b and expose the gate dielectric layer 102.

Figure 5D:
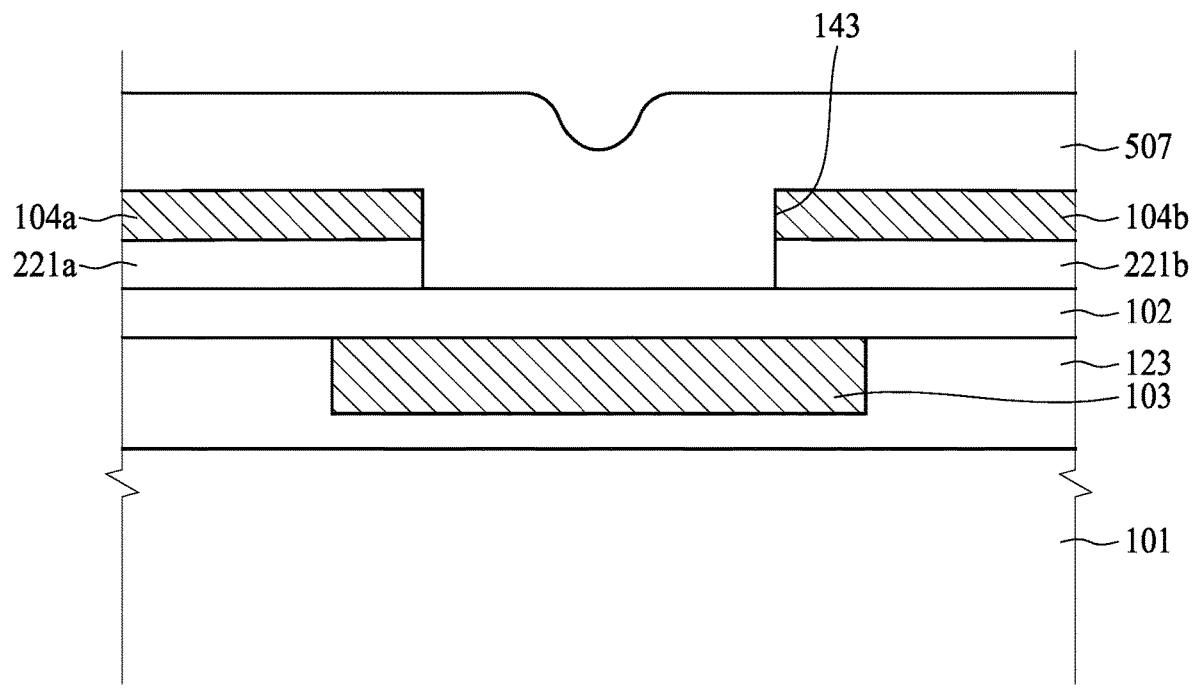

Referring to FIG. 5D, an oxide semiconductor material 507 is deposited in the opening 143 and on the source/drain electrodes 104a, 104b by, for example, a chemical vapor deposition (CVD technology or any other suitable technologies.

Figure 5E:
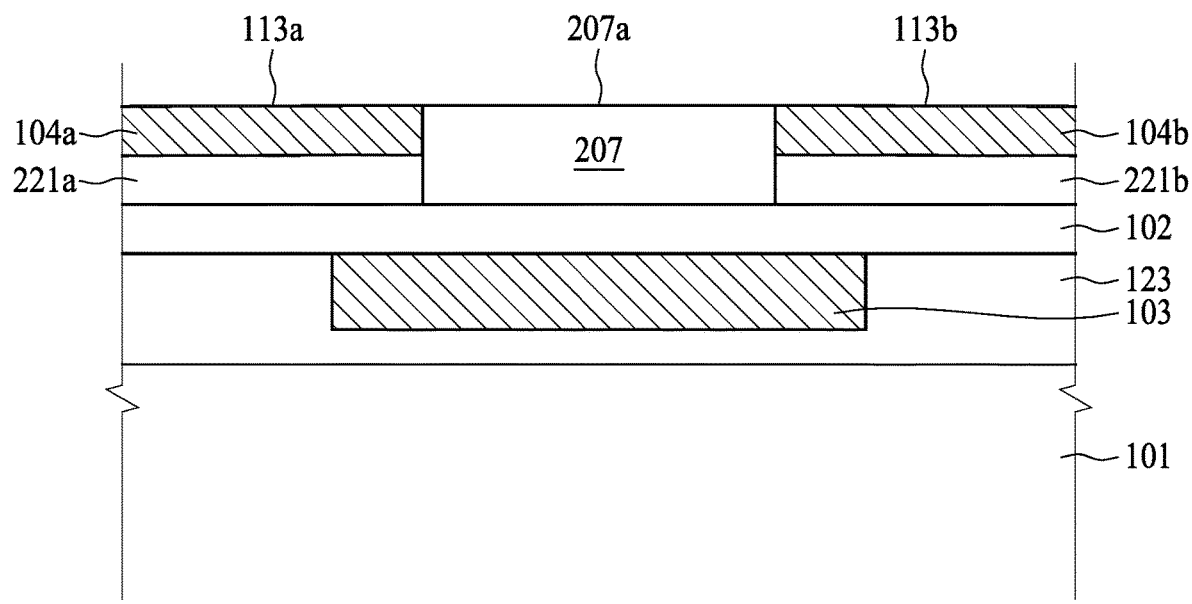

Referring to FIG. 5E, a chemical-mechanical polishing (MP) technology may be applied to the oxide semiconductor material 507 until the source/drain electrodes 104a, 104b are exposed. Subsequently, an active layer 207 that is between the source/drain electrodes 104a, 104b and has an upper surface 207a substantially in coplanar with an upper surface 113a, 113b of the source/drain electrodes 104a, 104b may be formed. As a result, a TFT, such as that illustrated in FIG. 2 may be formed.

Figure 5F:
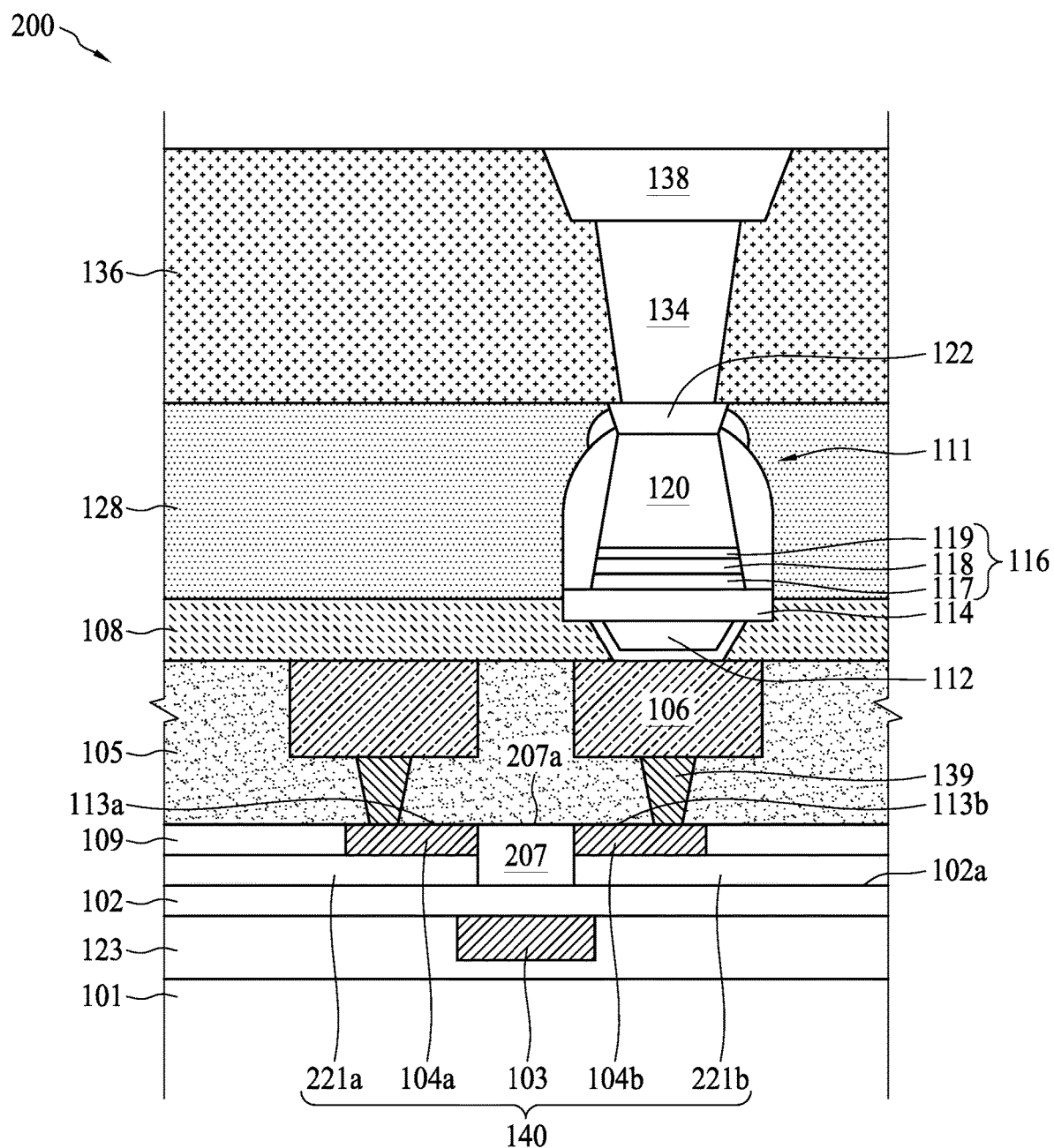

Referring to FIG. 5F, suitable technologies may be applied to dispose a MRAM cell 111 electrically coupled to the TFT 140, As a result, a memory device 200, such as the one illustrated in FIG. 2 may be obtained.

In some embodiments, a semiconductor device is provided. The semiconductor device includes a substrate, a thin-film transistor (TFT) over the substrate, and a magnetoresistive random-access memory (MRAM) cell electrically coupled to the TFT. The TFT includes a gate electrode; an active layer disposed above the gate electrode; source/drain electrodes disposed above the gate electrode and separated by the active layer; and at least two dielectric layers disposed between the gate electrode and the source/drain electrodes.

In some embodiments, an integrated circuit is provided. The integrated circuit includes a logic region and an embedded memory region. The logic region is disposed on a substrate. The embedded memory region is disposed over the substrate and includes a thin-film transistor (TFT) disposed over the substrate and a magnetoresistive random-access memory (MRAM) cell electrically coupled to the TFT. The TFT includes a gate electrode; an active layer disposed above the gate electrode; source/drain electrodes disposed above the gate electrode and separated by the active layer; and at least two dielectric layers disposed between the gate electrode and the source/drain electrodes.

In some embodiments, a method of manufacturing a semiconductor device is provided. The method includes disposing an interlayer dielectric (ILD) layer on a substrate; disposing a gate electrode of a thin-film transistor (TFT) in the ILD layer, wherein the gate electrode has an upper surface substantially coplanar with an upper surface of the ILD layer; disposing a gate dielectric layer over the gate electrode; disposing a dielectric layer over the gate dielectric layer; disposing source/drain electrodes of the TFT over the dielectric layer, wherein the dielectric layer and the source/drain electrodes define an opening; and disposing an active layer of the TFT in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a thin-film transistor (TFT) disposed over the substrate, the TFT comprising:
      a gate electrode;
      an active layer disposed above the gate electrode;
      source/drain electrodes disposed above the gate electrode and separated by the active layer; and
      at least two dielectric layers disposed between the gate electrode and the source/drain electrodes, wherein the active layer extends from a plane, which is coplanar with an upper surface of the source/drain electrodes, to an upper surface of a first dielectric layer of the at least two dielectric layers through a second dielectric layer of the at least two dielectric layers; and a magnetoresistive random-access memory (MRAM) cell electrically coupled to the TFT.

2. The semiconductor device of claim 1, wherein the active layer and the gate electrode are separated by a single dielectric layer and the source/drain electrodes and the gate electrode are separated by the at least two dielectric layers.

3. The semiconductor device of claim 1, wherein the first dielectric layer is disposed adjacent to the gate electrode, the second dielectric layer is disposed adjacent to the first dielectric layer, and the first dielectric layer has a dielectric constant higher than that of the second dielectric layer.

4. The semiconductor device of claim 1, wherein the second dielectric layer that is disposed adjacent to the source/drain electrodes is separated by the active layer.

5. The semiconductor device of claim 1, wherein the active layer has an upper surface substantially coplanar with the upper surface of the source/drain electrodes.

6. The semiconductor device of claim 1, further comprising an interlayer dielectric (ILD) layer disposed over the substrate, wherein the TFT is disposed over the ILD layer and an upper surface of the ILD layer is substantially coplanar with an upper surface of the gate electrode of the TFT.

7. The semiconductor device of claim 1, wherein an upper surface of the active layer of the TFT is substantially coplanar with the upper surface of the source/drain electrodes of the TFT.

8. The semiconductor device of claim 1, wherein the TFT is disposed in a back-end-of-line (BEOL) interconnect structure.

9. An integrated circuit, comprising:
a logic region disposed on a substrate; and
an embedded memory region disposed over the substrate, comprising:
  a thin-film transistor (TFT) disposed over the substrate, the TFT comprising:
    a gate electrode;
    an active layer disposed above the gate electrode;
    source/drain electrodes disposed above the gate electrode and separated by the active layer; and
    at least two dielectric layers disposed between the gate electrode and the source/drain electrodes, wherein the at least two dielectric layers includes a first dielectric layer disposed adjacent to the gate electrode and a second dielectric layer disposed adjacent to the first dielectric layer, and the active layer extends from a plane, which is coplanar with an upper surface of the source/drain electrodes, to an upper surface of the first dielectric layer through the second dielectric layer; and
  a magnetoresistive random-access memory (MRAM) cell electrically coupled to the TFT.

10. The integrated circuit of claim 9, wherein the active layer and the gate electrode are separated by a single dielectric layer and the source/drain electrodes and the gate electrode are separated by the at least two dielectric layers.

11. The integrated circuit of claim 9, wherein the first dielectric layer has a dielectric constant higher than that of the second dielectric layer.

12. The integrated circuit of claim 9, wherein a dielectric layer that is disposed adjacent to the source/drain electrodes is separated by the active layer.

13. The integrated circuit of claim 9, wherein the active layer has an upper surface substantially coplanar with the upper surface of the source/drain electrodes.

14. The integrated circuit of claim 9, further comprising an interlayer dielectric (ILD) layer disposed over the substrate, wherein the TFT is disposed over the ILD layer and an upper surface of the ILD layer is substantially coplanar with an upper surface of the gate electrode of the TFT.

15. The integrated circuit of claim 14, wherein the logic region comprises a transistor and a portion of the transistor is within the ILD layer.

16. The integrated circuit of claim 9, wherein an upper surface of the active layer of the TFT is substantially coplanar with the upper surface of the source/drain electrodes of the TFT.

17. An integrated circuit, comprising:
a logic region disposed on a substrate; and
an embedded memory region disposed over the substrate, comprising:
  a thin-film transistor (TFT) disposed over the substrate, the TFT comprising:
    a gate electrode;
    an active layer disposed above the gate electrode;
    source/drain electrodes disposed above the gate electrode and separated by the active layer; and
    at least two dielectric layers disposed between the gate electrode and the source/drain electrodes,
    wherein the active layer extends from a plane, which is coplanar with an upper surface of the source/drain electrodes, to an upper surface of a first dielectric layer of the at least two dielectric layers through a second dielectric layer of the at least two dielectric layers; and
  a magnetoresistive random-access memory (MRAM) cell electrically coupled to the TFT.

18. The integrated circuit of claim 17, wherein an upper surface of the active layer of the TFT is substantially coplanar with the upper surface of the source/drain electrodes of the TFT.

19. The integrated circuit of claim 17, wherein the TFT is disposed in a back-end-of-line (BEOL) interconnect structure.

20. The integrated circuit of claim 17, wherein the MRAM cell electrically coupled to the TFT by a via and one or more metal line.

* * * * *